United States Patent
Cheng et al.

(10) Patent No.: US 10,204,969 B2
(45) Date of Patent: Feb. 12, 2019

(54) ORGANIC LIGHT-EMITTING DISPLAY PANEL, FABRICATION METHOD THEREOF, AND DISPLAY APPARATUS

(71) Applicant: Shanghai Tianma AM-OLED Co., Ltd., Shanghai (CN)

(72) Inventors: Shuang Cheng, Shanghai (CN); Jinghua Niu, Shanghai (CN); Xiangcheng Wang, Shanghai (CN); Yuji Hamada, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/869,973

(22) Filed: Jan. 12, 2018

(65) Prior Publication Data
US 2018/0138252 A1    May 17, 2018

(30) Foreign Application Priority Data
Sep. 12, 2017  (CN) ............... 2017 1 0817660

(51) Int. Cl.
*H01L 27/32* (2006.01)
*H01L 51/42* (2006.01)
*H01L 51/50* (2006.01)

(52) U.S. Cl.
CPC ...... *H01L 27/3246* (2013.01); *H01L 51/4273* (2013.01); *H01L 51/5096* (2013.01); *H01L 27/326* (2013.01); *H01L 51/504* (2013.01)

(58) Field of Classification Search
CPC ............................................... H01L 51/5096
USPC ........................................ 257/98; 438/29
See application file for complete search history.

(56) References Cited

U.S. PATENT DOCUMENTS 9,312,319 B2 * 4/2016 Lee .................. H01L 27/3246
                                                             257/40
2018/0182812 A1 * 6/2018 Heo .................. H01L 27/1462

FOREIGN PATENT DOCUMENTS

CN          103094491 A      5/2013

* cited by examiner

*Primary Examiner* — Calvin Lee
(74) *Attorney, Agent, or Firm* — Anova Law Group, PLLC

(57) ABSTRACT

An organic light-emitting display panel, a fabrication method thereof, and a display apparatus are provided. The organic light-emitting display panel comprises a substrate; a plurality of blocking structures disposed on the substrate, wherein a blocking structure has a first surface facing the substrate and an opposing second surface far away from the substrate; a plurality of first electrodes, wherein a first electrode is configured between adjacent blocking structures; an organic functional film layer covering at least one of the plurality of first electrodes and the plurality of blocking structures, wherein the organic functional film layer includes a light-emitting layer; and a degradation region disposed in a portion of the second surface of the blocking structure, wherein the degradation region degrades a carrier transportation in a portion of the organic functional film layer in which the portion of the organic functional film layer covers the degradation region.

19 Claims, 8 Drawing Sheets

ORGANIC LIGHT-EMITTING DISPLAY PANEL, FABRICATION METHOD THEREOF, AND DISPLAY APPARATUS

CROSS-REFERENCES TO RELATED APPLICATIONS

This application claims the priority of Chinese Patent Application No. 201710817660.2, filed on Sep. 12, 2017, the entire contents of all of which are incorporated herein by reference.

FIELD OF THE DISCLOSURE

The present disclosure generally relates to the field of display technology and, more particularly, relates to an organic light-emitting display panel, a fabrication method thereof, and a display apparatus.

BACKGROUND

Organic light-emitting diode display panels (OLEDs) are different from traditional liquid crystal display panels (LCDs) in display methods. OLED display panels do not need a backlight source, and the organic material layer which works as a light-emitting layer is substantially thin. Compared to LCD display panels, OLED display panels are featured with a light and thin design, a substantially low power consumption, and a wide viewing angle.

In an existing fabrication process of the OLED display panel, the organic light-emitting diode devices are often fabricated by sharing common film layers. For example, a carrier transport layer configured to enhance the transportability of carriers (such as an electron transport layer configured to enhance the transportability of electrons, a hole transport layer configured to enhance the transportability of holes), and electrodes covering all light-emitting devices are often formed as one layer at one time in a coplanar manner, without graphical patterning individual film layers. Thus, the fabrication process is simplified. However, because of the common film layer structure, carriers may be transported laterally within the boundary of the common film layer, and may be drifted to adjacent pixels to generate undesired light, thereby causing crosstalk between adjacent light-emitting devices.

The disclosed display panel, fabrication method thereof, and display apparatus are directed to solve one or more problems set forth above and other problems.

BRIEF SUMMARY OF THE DISCLOSURE

One aspect of the present disclosure provides an organic light-emitting display panel, comprising: a substrate; a plurality of blocking structures disposed on the substrate, wherein a blocking structure has a first surface facing the substrate and an opposing second surface far away from the substrate; a plurality of first electrodes, wherein a first electrode is configured between adjacent blocking structures; an organic functional film layer covering at last one of the plurality of first electrodes and the plurality of blocking structures, wherein the organic functional film layer includes a light-emitting layer; and a degradation region disposed in a portion of the second surface of the blocking structure, wherein the degradation region degrades a carrier transportation in a portion of the organic functional film layer in which the portion of the organic functional film layer covers the degradation region.

Another aspect of the present disclosure provides a display apparatus comprising a disclosed organic light-emitting display panel.

Another aspect of the present disclosure provides a fabrication method for the disclosed organic light-emitting display panel, comprising: providing a substrate; forming a plurality of first electrodes on the substrate; forming a plurality of blocking structures, wherein a blocking structure is disposed between adjacent first electrodes and has a first surface facing the substrate and an opposing second surface far away from the substrate; forming a degradation region on a portion of the second surface of the block structure; and forming an organic functional film layer on at least one of the blocking structure and the first electrode. The organic functional film layer includes a light-emitting layer. The degradation region degrades the carrier transportation in a portion of the organic functional film layer covering the degradation region in which the portion of the organic functional film layer covers the degradation region.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
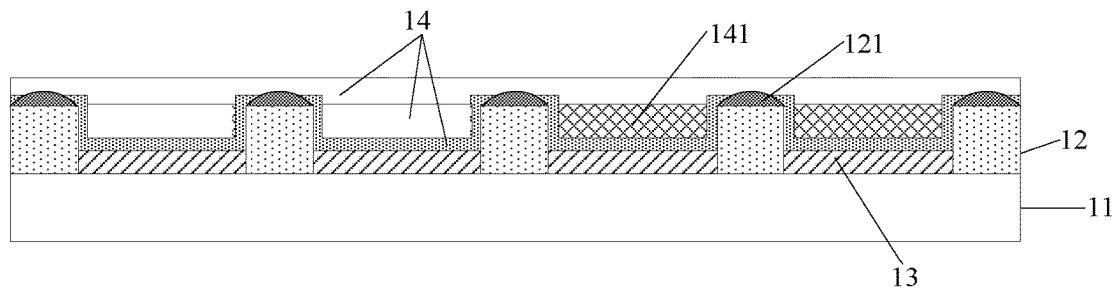
FIG. 1 illustrates a cross-sectional view of an exemplary organic light-emitting display panel according to the disclosed embodiments.

The present disclosure provides an organic light-emitting display panel, a fabrication method thereof, and a display apparatus, which are capable of suppressing crosstalk between adjacent light-emitting devices.

To make the objectives, features, and functions of the present disclosure more comprehensible, the present disclosure will be described with reference to the accompanying drawings and embodiments. However, the exemplary embodiments are presented for illustrative purposes and should not be construed as limitations. On the contrary, the disclosed embodiments are provided so that the present disclosure will be described thoroughly and completely, and will fully convey the concepts and the inventive thinking of the exemplary embodiments to those skilled in the art. The same reference labels and numerals in the drawings denote the same or similar structures, and a repetitive description thereof will be omitted. The expressions and the directions of the present disclosure are described with reference to the accompanying drawings. However, changes may be made if necessary, and all the changes are within the scope of the present disclosure. The drawings are only used for illustrating the relative position relationship, and certain structures may be shown in a disproportional scale for the purpose of comprehension. The dimensions in the drawings do not represent the actual proportional relationship.

It should be noted that, the specific details are set forth in the following description for the purpose of comprehension. However, the present disclosure could be implemented in various alternative ways different from those described herein, and those skilled in the art can make similar inferences without departing from the spirit of the present disclosure. Therefore, the present disclosure is not limited to the exemplary embodiments described below. As used throughout the specifications and claims, it is intended that one element "on one side of the other" include the element adjacent or non-adjacent to the other element. Similarly, it is intended that a component is located on one side of the other component departing from the other component include the component adjacent or non-adjacent to the other component. The description in the specification incorporates preferred embodiments for the purpose of illustrating the general principles and is not intended to limit the scope of the present disclosure. The scope of the present disclosure shall be determined by the appended claims.

The organic light-emitting display panel, the fabrication method thereof, and the display apparatus provided by the embodiments of the present disclosure are described in detail below with reference to the accompanying drawings. However, thickness and shape of each component in the drawings do not reflect the actual scale of the display panel, and are merely intended to illustrate the present disclosure.

FIG. 1 illustrates a cross-sectional view of an exemplary organic light-emitting display panel according to the disclosed embodiments. As shown in FIG. 1, the organic light-emitting display panel may include a substrate 11, a plurality of blocking structures 12 disposed on the substrate 11 wherein a blocking structure has a first surface facing the substrate 11 and an opposing second surface far away from the substrate 11, a plurality of first electrodes 13 disposed between adjacent blocking structures 12, and an organic functional film layer 14 covering the plurality of the first electrodes 13 and/or the plurality of the blocking structures 12 (i.e., an organic functional film layer 14 covering at least one of the plurality of the first electrodes 13 and the plurality of the blocking structures 12). The organic functional film layer 14 may include a light-emitting layer 141.

A degradation region 121 may be configured in a portion of the second surface of a blocking structure 12. The degradation region 121 may be configured to degrade a carrier transportation in a portion of the organic functional film layer in which the portion of the organic functional film layer covers the degradation region.

Because the organic functional film layer 14 in the organic light emitting display panel is often made of organic materials which are sensitive to moisture and oxygen, the organic functional film layer 14 may be degraded when being exposed to moisture and oxygen. However, the disclosed embodiments may take advantages of the degrading of the organic functional film layer 14 after being exposed to moisture and oxygen.

In one embodiment, a degradation region 121 may be configured on a portion of the second surface of each blocking structure 12. The degradation region 121 may degrade the organic material, such that the carriers may be suppressed to be transported in the organic material. When the organic light-emitting display panel is in a normal operation, the first electrode 13 and the organic functional film layer 14 configured above the first electrode 13 may form a light-emitting unit. When a voltage signal is supplied to the first electrode 13, carriers may be transported in the light-emitting unit. However, because the portion of the organic functional film layer 14 disposed on the second surface of each blocking structure 12 is degraded, carriers in the light-emitting unit may be suppressed to be transported to adjacent light-emitting units. Thus, the crosstalk between adjacent light-emitting units may be suppressed.

Further, to maintain the normal carrier transportation in the organic functional film layer 14 corresponding to the light-emitting unit, the degradation region 121 may only be configured on a portion of the second surface of the blocking structure 12. The concentration of oxygen atoms in the degradation region 121 may be configured within a desired range, such that the portion of the organic functional film layer 14 covering the degradation region 121 may be degraded, while the carrier transportation in the organic functional film layer 14 corresponding to the light-emitting unit may substantially remain the same.

In one embodiment, the concentration of oxygen atoms in the degradation region 121 may be configured to be at least 100 ppm, then the portion of the organic functional film layer 14 covering the degradation region 121 may be effectively degraded. The concentration of the oxygen atoms in the degradation region 121 is not limited by the present disclosure. In practical applications, when the thickness of the organic function film layer 14 increases or decreases, the concentration of the oxygen atoms in the degradation region 121 may be increased or decreased accordingly.

Figure 2A:
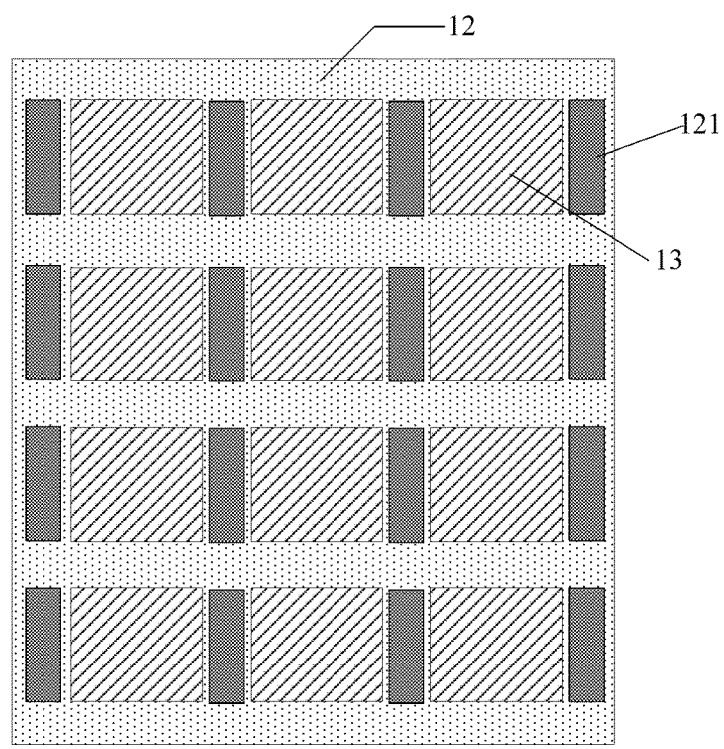
FIG. 2A illustrates a top view of exemplary degradation regions in an exemplary organic light-emitting display panel according to the disclosed embodiments.

FIG. 2A illustrates a top view of exemplary degradation regions in an exemplary organic light-emitting display panel according to the disclosed embodiments. As shown in FIG. 2A, the degradation region 121 may be configured between any two adjacent first electrodes 13. In the display panel shown in FIG. 2A, the plurality of the degradation regions 121 may suppress crosstalk between adjacent light-emitting units in a horizontal direction. In practical applications, the plurality of the first electrodes 13 may often be arranged in an array on the substrate 11. That is, the plurality of the light-emitting units may also be arranged in an array. Thus, in the display panel shown in FIG. 2A, crosstalk may exist not only between adjacent light-emitting units arranged in the horizontal direction but also between adjacent light-emitting units arranged in a vertical direction.

Figure 2B:
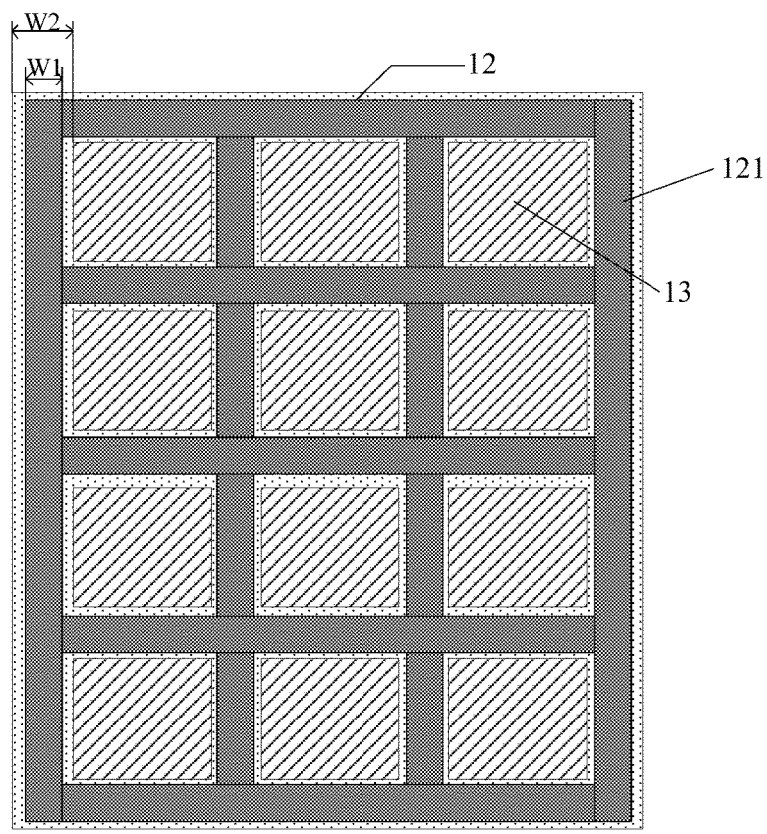
FIG. 2B illustrates a top view of exemplary degradation regions in another exemplary organic light-emitting display panel according to the disclosed embodiments.

In view of this, FIG. 2B illustrates a top view of exemplary degradation regions in another exemplary organic light-emitting display panel according to the disclosed embodiments to solve one or more problems set forth above in FIG. 2A. The similarities between FIG. 2B and FIG. 2A are not repeated, while certain difference may be explained.

As shown in FIG. 2B, the degradation region 121 may be configured on the surface of the blocking structure 12 surrounding each first electrode 13. That is, an orthogonal projection of the degradation region 121 onto the substrate 11 may surround an orthogonal projection of the first electrode 13 onto the substrate 11. Thus, not only the crosstalk between adjacent light-emitting units arranged in the horizontal direction, but also the crosstalk between adjacent light-emitting units arranged in the vertical direction may be suppressed.

To prevent a carrier transportation degradation in the organic functional film layer 14 corresponding to the light-emitting units (i.e., corresponding to the first electrodes 13), the orthogonal projection of the degradation region 121 onto the substrate 11 may not overlap with the orthogonal projection of the first electrode 13 onto the substrate 11. In one embodiment, as shown in FIG. 2B, the degradation region 121 may have a maximum width W1, which is smaller than two thirds of a minimum width W2 of the blocking structure 12. The degradation region 121 may contain oxygen atoms which are able to degrade the organic functional film layer 14, while the degraded organic functional film layer 14 may be still able to diffuse oxygen atoms to a certain degree. Thus, through configuring the width of the degradation region 121 to be smaller than the width of the blocking structure 12, a buffer space (which has a width of W2-W1) may be reserved for the diffusion caused by the degraded organic functional film layer 14. Accordingly, the degradation region 121 may be prevented from degrading the organic functional film layer 14 corresponding to the adjacent light-emitting units.

In the disclosed embodiments, the degradation region 121 may be formed in various ways. In one embodiment, the second surface of the blocking structure 12 may be subject to a cured oxygen plasma treatment. The degradation region 121 may be a portion of the second surface of the corresponding blocking structure 12, in which the portion of the surface of the corresponding blocking structure 12 has been subject to the cured oxygen plasma treatment. In practical applications, after the blocking structure 12 is formed, a portion of the blocking structure 12 may be oxygen plasma treated to form the degradation region 121, such that oxygen atoms are cured in the degradation region 121. Thus, the portion of the organic functional film layer 14 covering the degradation region 121 may be degraded, and carriers may be suppressed to be transported in the degraded organic functional film layer 14. In the degradation region 121 formed by the cured oxygen plasma treatment, the degradation region 121 may be a portion of the second surface of the blocking structure 12 with no added thickness.

In one embodiment, the oxygen atom concentration in the degradation region 121 may be at least 100 ppm. On one hand, a substantially low oxygen atom concentration may be insufficient to degrade the intended portion of the organic functional film layer 14. On the other hand, a substantially high oxygen atom concentration may enable the oxygen atoms to diffuse to the organic functional film layer in the normal light-emitting region. Thus, to effectively degrade the portion of the organic functional film layer 14 covering the degradation region 121, the oxygen atom concentration in the degradation region may be configured to be within a certain range greater than 100 ppm. In practical applications, the oxygen atom concentration in the degradation region 121 may be increased or decreased in proportional to the rise and fall of the thickness of the organic functional film layer 14, which is not limited by the present disclosure.

In another embodiment, the degradation region 121 may be formed by using predetermined materials. For example, the material of the degradation region 121 may be a photo-catalyst. Photo-catalysts refer to chemicals that act as a catalyst under the excitation of photons. In the disclosed embodiments, the photo-catalyst may decompose the portion of the organic functional film layer 14 under the excitation of photons, such that carriers may be suppressed to be transported in the portion of the organic functional film layer 14. In practical applications, a photo-catalyst may be configured to form the degradation regions 121. The photo-catalyst may be applied to a portion of the second surface of the blocking structure 12, such that the portion of the organic functional film layer 14 covering the photo-catalyst may be decomposed, and carriers may be suppressed to be transported to adjacent light-emitting units.

In one embodiment, the photo-catalyst may be titanium dioxide ($TiO_2$). When being irradiated by ultraviolet (UV) light, titanium dioxide may have a strong photo-catalytic effect. In the practical fabrication processes, a titanium dioxide film having a pre-determined thickness may be formed on a portion of the second surface of the blocking structure 12. Then, an organic functional film layer 14 may be formed on the blocking structure 12 having the titanium dioxide film and/or the first electrode 13 (i.e., formed on at least one of the blocking structure 12 having the titanium dioxide film and the first electrode 13). By irradiating the UV light on the display panel, a certain portion of the organic functional film layer 14 may be decomposed by the catalytic effect of titanium dioxide. Thus, carriers may be suppressed to be transported in the decomposed portion of the organic functional film layer 14.

In one embodiment, the degradation region 121 may be configured to have a thickness thinner than about 50 nm. Because the organic functional film layer 14 is substantially thin, a substantially thick degradation region 121 may also degrade the adjacent normal light-emitting region. Thus, the degradation region 121 may be configured to be thinner than the organic functional film layer 14 or an organic light-emitting device to ensure the normal operation of the light-emitting unit. In practical applications, the organic light-emitting device may have a thickness approximately between 500 nm and 3000 nm. The degradation region 121 may be configured to have a thickness thinner than one tenth of the thickness of the organic light-emitting device, thereby avoiding a substantial increase of the overall thickness of the display panel due to the substantially thick degradation region 121.

Figure 3:
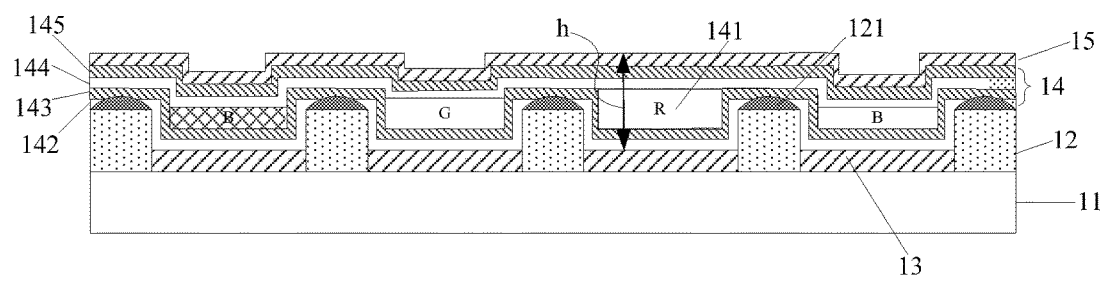
FIG. 3 illustrates a cross-sectional view of another exemplary organic light-emitting display panel according to the disclosed embodiments.

FIG. 3 illustrates a cross-sectional view of another exemplary organic light-emitting diode display panel according to the disclosed embodiments. The differences between FIG. 3 and FIG. 1 are not repeated, while certain difference may be explained.

As shown in FIG. 3, the organic functional film layer 14 may further include a hole injection layer 142 covering the first electrodes 13 and/or the blocking structures 12 where the hole injection layer 142 has a first side facing the first electrode 13 and an opposing second side far away from the first electrode 13, a hole transport layer 143 disposed on the second side of the hole injection layer 142 where the hole transport layer 143 has a first side facing the first electrode 13 and an opposing second side far away from the first electrode 13, an electron transport layer 144 disposed on the second side of the hole transport layer 143 where the electron transport layer 144 has a first side facing the first electrode 13 and an opposing second side far away from the first electrode 13, and an electron injection layer 145 disposed on the second side of the electron transport layer 144 where the electron injection layer 145 has a first side facing the first electrode 13 and an opposing second side far away from the first electrode 13. The light-emitting layer 141 may be disposed between the hole transport layer 143 and the electron transport layer 144.

The organic light-emitting diode display panel may further include a second electrode 15 disposed on the second side of the electron injection layer 145 where the second electrode 15 has a first side facing the first electrode 13 and an opposing side far away from the first electrode 13. Further, the first electrode 13 has a first side facing the second electrode 15 and an opposing side far away from the second electrode 15

In one embodiment, electrons and holes may be injected from the second electrode 15 and the first electrode 13, respectively. However, the second electrode 15 and the first electrode 13 may have limited capacity for injecting holes and electrons. To increase carrier injection efficiency, the hole injection layer 142 may be configured on the first side of the first electrodes 13, and the electron injection layer 145 may be configured on the first side of the second electrode 15. Further, the electrons injected by the second electrode 15 and the holes injected by the first electrode 13 may be transported to the light-emitting layer 141 to be recombined to release energy. The energy may be absorbed by the material of the light-emitting layer 141 to emit light.

To transport carriers more effectively, the hole transport layer 143 may be configured between the hole injection layer 142 and the light-emitting layer 141, and the electron transport layer 144 may be configured between the electron injection layer 145 and the light-emitting layer 141, such that the exciton recombination efficiency may be increased. Thus, the first electrode 13, the second electrode 15, and the hole injection layer 142, the hole transport layer 143, the light-emitting layer 141, the electron transport layer 144, and the electron injection layer 145 disposed between the first electrode 13 and the second electrode 15 may form the organic light-emitting diode device.

Because the organic light-emitting diode devise is substantially thin, compared to the width of the degradation region 121, the thickness of the organic light-emitting diode device may be substantially smaller. Thus, to effectively suppress the degradation of various organic film layers in the organic light-emitting diode device, which is caused by the diffusion of oxygen atoms from the degradation region 121, a maximum width of the degradation region 121 may be configured to be smaller than three times a maximum height between the first side of the hole injection layer 142 and the second side of the second electrode 15.

In one embodiment, as shown in FIG. 3, the light-emitting layer 141 may include a plurality of red light-emitting regions R, a plurality of green light-emitting regions G, and a plurality of blue light-emitting regions B. The light-emitting regions of different colors may be separated by a pre-determined distance. When the light-emitting layer 141 includes the light-emitting regions of different colors, each light-emitting region may correspond to one light-emitting unit. The light-emitting units may be separated by the blocking structures 12.

The organic light-emitting diode display panel may take advantage of a micro-cavity effect between the first electrode 13 and the second electrode 15 to enhance light emission at individual pre-determined wavelength. For example, when the light-emitting layer 141 includes red light-emitting regions R, green light-emitting regions G, and blue light-emitting regions B, the red light may have the longest wavelength, and the blue light may have the shortest wavelength. According to the principle of the micro-cavity effect, the distance between the first electrode 13 and the second electrode 15 may be the largest in the red light-emitting region R, and the distance between the first electrode 13 and the second electrode 15 may be the smallest in the blue light-emitting region B. Accordingly, the red light-emitting region R may be the thickest, and the blue light-emitting region B may be the thinnest. Thus, the portion of the organic functional film layer 14 corresponding to the red light-emitting region R may be the thickest, and the maximum width of the corresponding degradation region 121 may be smaller than three times a height h between the first side of the hole injection layer 142 and the second side of the second electrode 15.

When the organic light-emitting diode display panel is a full-color display panel including light-emitting units of a plurality of colors, the light-emitting region of each respective color may correspond to one first electrode. Each light-emitting region, the first electrode and the second electrode disposed on both sides of the light-emitting region may form a light emitting unit. Through controlling display brightness of each light-emitting unit, the display panel may display images.

In practical applications, the organic light-emitting diode display panel in the disclosed embodiments may be a top-emitting type or a bottom-emitting type. For example, when the organic light-emitting diode display panel is the top-emitting type, the first electrode may be an anode functioning as a reflective electrode. The first electrode may be made of a transparent conductive material such as indium tin oxide (ITO), indium zinc oxide (IZO), zinc oxide (ZnO), or indium oxide ($In_2O_3$). A reflective layer may be formed in the transparent electrode. The reflective layer may be made of Ag, Mg, Al, Pt, Pd, Au, Ni, Nd, Ir, Cr, or a mixture thereof. Thus, a three-layer stacked structure of the transparent electrode, the reflective layer, and the transparent electrode may be formed.

The second electrode may be a cathode, and may be a transparent electrode. The second electrode may be made of Li, Ca, LiF/Ca, LiF/Al, Al, Mg, or a mixture thereof. When the organic light-emitting diode display panel is the bottom-emitting type, the first electrode may be the transparent electrode, and the second electrode may be the reflective electrode. The first electrode may be made of ITO, IZO, ZnO, or $In_2O_3$, and the second electrode may be made of Li, Ca, LiF/Ca, LiF/Al, Al. Mg, or a mixture thereof.

Figure 4:
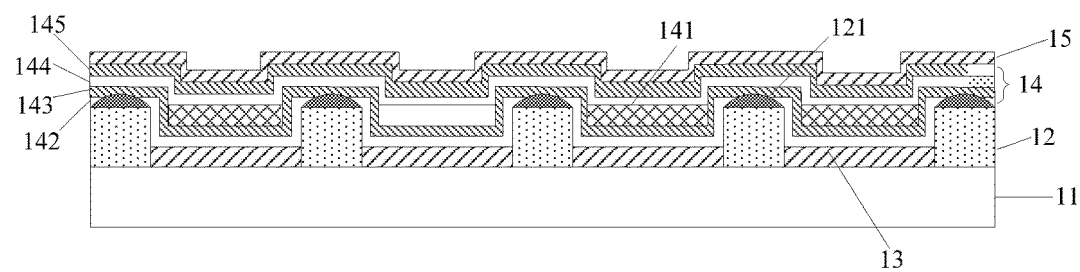
FIG. 4 illustrates a cross-sectional view of another exemplary organic light-emitting display panel according to the disclosed embodiments.

In one embodiment, the organic light-emitting diode display panel may be a single-color display panel. For example, the organic light-emitting diode display panel may be a white color organic light-emitting diode display panel. FIG. 4 illustrates a cross-sectional view of another exemplary organic light-emitting diode display panel according to the disclosed embodiments. As shown in FIG. 4, the organic light-emitting diode display panel may be the white color organic light-emitting diode display panel, and the light-emitting layer 141 may be a white light-emitting layer. In one embodiment, the organic functional film layer 14 may include common film layers such as the hole injection layer 142, the hole transport layer 143, the light-emitting layer 141, the electron transport layer 144, and the electron injection layer 145. A voltage signal 13 may be supplied to the first electrode to control brightness of the light emitted from the first electrode 13. Thus, the common film layers display panel may display images.

Figure 5A:
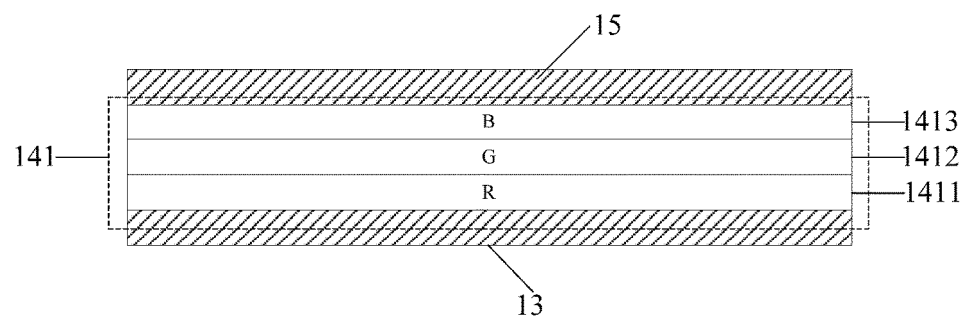
FIG. 5A illustrates a cross-sectional view of an exemplary light-emitting layer in an exemplary organic light-emitting display panel according to the disclosed embodiments.

FIG. 5A illustrates a cross-sectional view of an exemplary light-emitting layer in an exemplary organic light-emitting diode display panel according to the disclosed embodiments. In one embodiment, as shown in FIG. 5A, the light-emitting layer 141 may be the white light-emitting layer. The white light-emitting layer may include a red light-emitting sub-layer 1411, a green light-emitting sub-layer 1412, and a blue light-emitting sub-layer 1413, stacked together. Depending on the light-emitting type of the organic light-emitting diode display panel, the red light-emitting sub-layer 1411, the green light-emitting sub-layer 1412, and the blue light-emitting sub-layer 1413 may be sequentially configured in a light emission direction. For example, when the organic light-emitting diode display panel is a top-emitting type, the red light-emitting sub-layer 1411 may be disposed close to the first electrode 13, and the blue light-emitting sub-layer 1413 may be disposed close to the second electrode 15. When the organic light-emitting diode display panel is the bottom-emitting type, the red light-emitting sub-layer 1411 may be disposed close to the second electrode 15, and the blue light-emitting sub-layer 1413 may be disposed close to the first electrode 13.

Figure 5B:
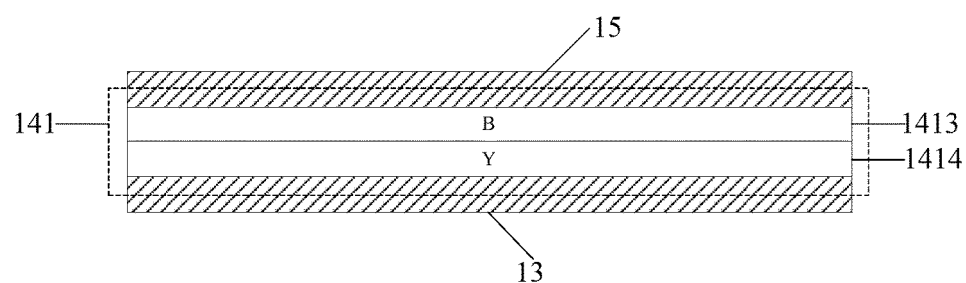
FIG. 5B illustrates a cross-sectional view of another exemplary light-emitting layer in an exemplary organic light-emitting display panel according to the disclosed embodiments.

FIG. 5B illustrates a cross-sectional view of another exemplary light-emitting layer in an exemplary organic light-emitting diode display panel according to the disclosed embodiments. In one embodiment, as shown in FIG. 5B, the light-emitting layer 141 may be the white light-emitting layer. The white light-emitting layer may include a yellow light-emitting sub-layer 1414, and a blue light-emitting sub-layer 1413. Similarly, depending on the light-emitting type of the OLED display panel, the yellow light-emitting sub-layer 1414 and the blue light-emitting sub-layer 1413 may be sequentially configured along the final light emission direction. In the embodiment, the light-emitting film layers may be stacked in such a way to prevent the light-emitting film layer that emits higher energy light (shorter wavelength, such as blue light) from affecting the light-emitting film layer that emits lower energy light (longer wavelength, such as red light).

Based on the same inventive idea, the present disclosure also provides a display apparatus. The display apparatus may include any one of the disclosed organic light-emitting diode display panels. The display apparatus may be an organic light-emitting diode monitor, an organic light-emitting diode television, or other devices having the display function. The display apparatus may also be a smart phone, a tablet computer, a laptop computer, a notebook computer, or other portable devices having the display function, which are for illustrative purposes, and are not intended to limit the scope of the present disclosure.

Figure 6:
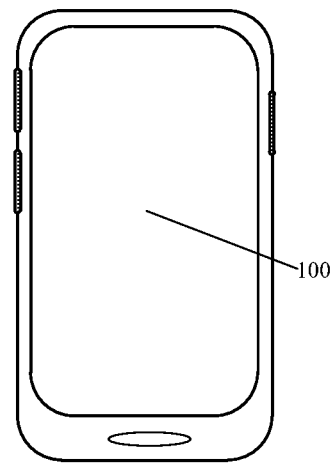
FIG. 6 illustrates a schematic view of an exemplary display apparatus according to the disclosed embodiments.

FIG. 6 illustrates a schematic view of an exemplary display apparatus according to the disclosed embodiments. In one embodiment, as shown in FIG. 6, the display apparatus may be the smart phone. The display apparatus may include a display panel 100. The display panel may be any one of the disclosed organic light-emitting diode display panels. Because the display apparatus includes a disclosed organic light-emitting diode display panel, the display apparatus may include the features and functions of the disclosed organic light-emitting diode display panel. The detail description of the display apparatus may refer to the embodiments of the disclosed organic light-emitting diode display panel, and will not be repeated herein.

Figure 7:
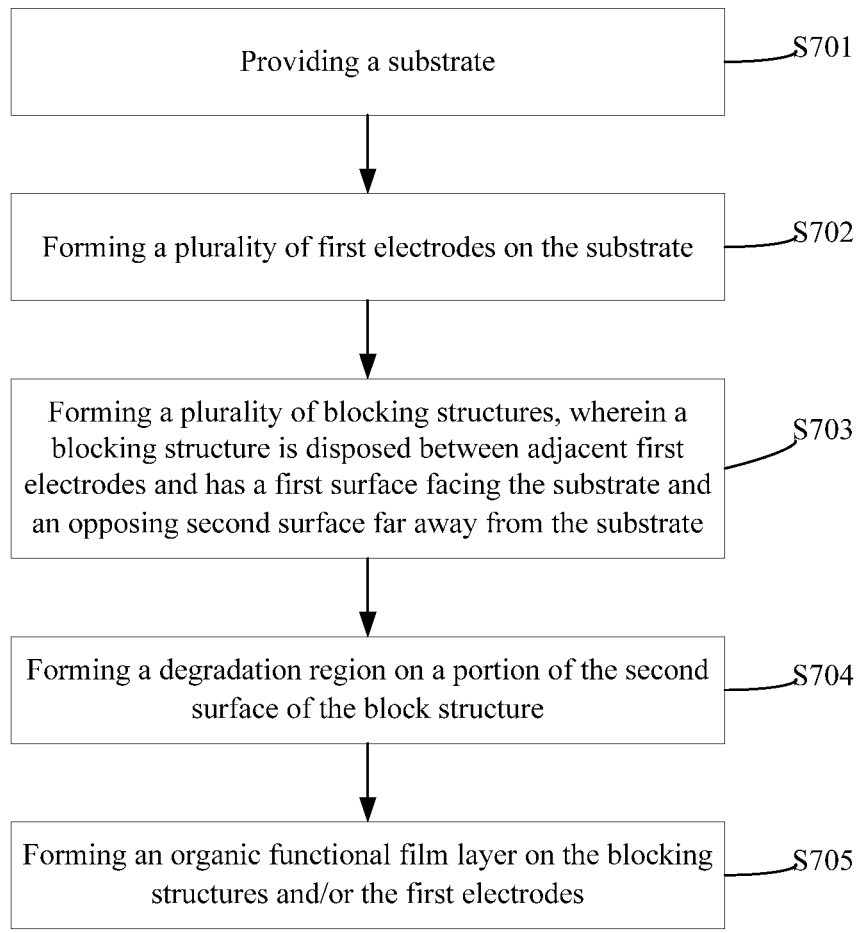
FIG. 7 illustrates a flow chart of an exemplary organic light-emitting display panel fabrication method according to the disclosed embodiments.

Further, the present disclosure also provides a fabrication method for an organic light-emitting diode display panel. FIG. 7 illustrates a flow chart of an exemplary organic light-emitting diode display panel fabrication method according to the disclosed embodiments. FIGS. 8A-8D illustrate various cross-sectional views of an exemplary organic light-emitting diode display panel at different stages of the fabrication process according to the disclosed embodiments. FIGS. 9A-9H illustrate various cross-sectional views of another exemplary organic light-emitting diode display panel at different stages of the fabrication process according to the disclosed embodiments.

As shown in FIG. 7, the fabrication method for the disclosed organic light-emitting diode display panel may include the following steps.

Step S701: providing a substrate.

Step S702: forming a plurality of first electrodes on the substrate. The corresponding structure is shown in FIG. 8A and FIG. 9A.

Figure 8A:
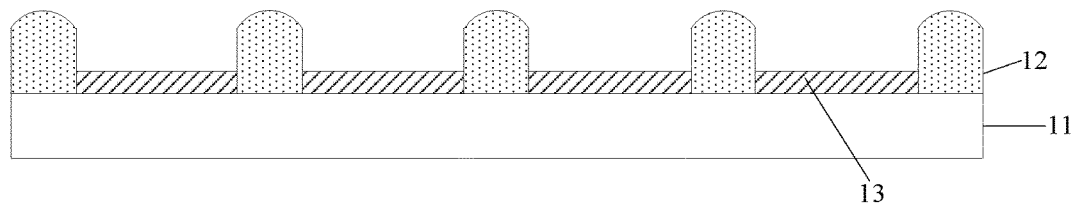
FIGS. 8A-8D illustrate various cross-sectional views of an exemplary organic light-emitting display panel at different stages of the fabrication process according to the disclosed embodiments.
Figure 8B:
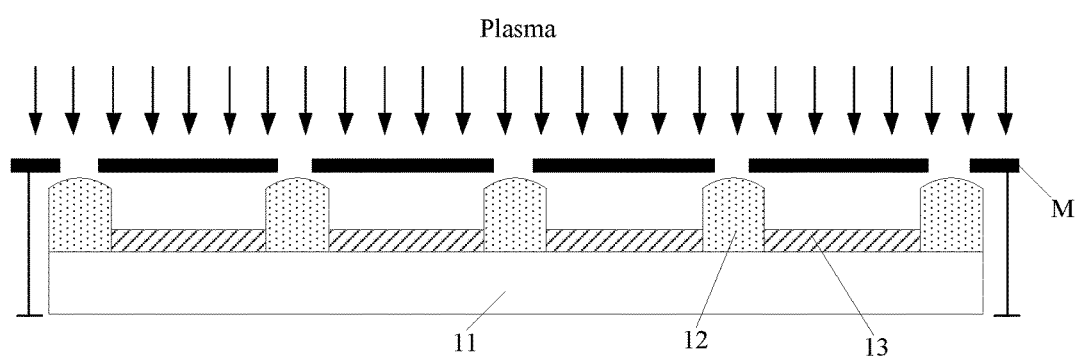
Figure 9A:
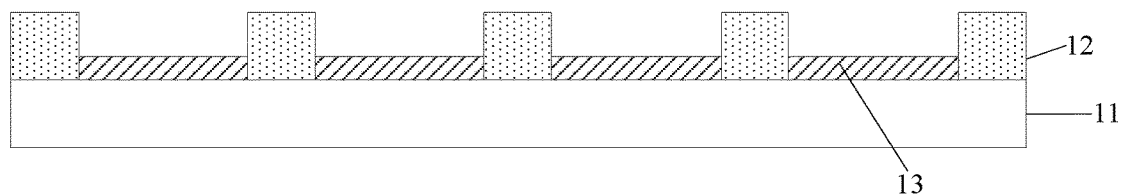
FIGS. 9A-9H illustrate various cross-sectional views of another exemplary organic light-emitting display panel at different stages of the fabrication process according to the disclosed embodiments.
Figure 9B:
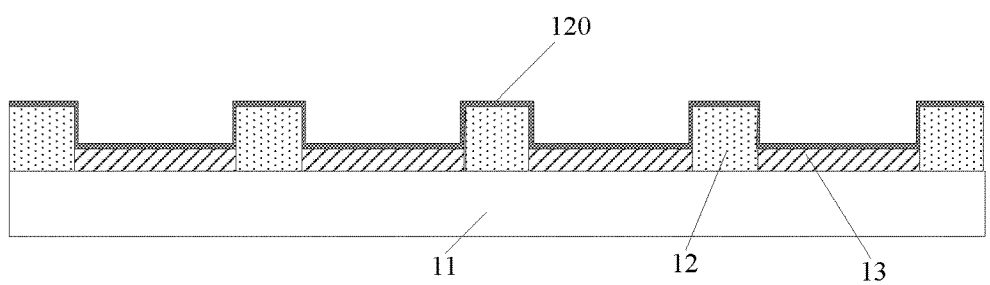

In particular, referring to FIG. 8A and FIG. 9A, a plurality of first electrodes 13 may be formed on the substrate 11.

Step S703: forming a plurality of blocking structures, where a blocking structure is disposed between adjacent first electrodes, and has a first surface facing the substrate and an opposing second surface far away from the substrate. The corresponding structure is shown in FIG. 8A and FIG. 9A.

In particular, referring to FIG. 8A and FIG. 9A, a plurality of blocking structures 12 may be formed on the substrate 11 between adjacent first electrode 13.

Figure 8C:
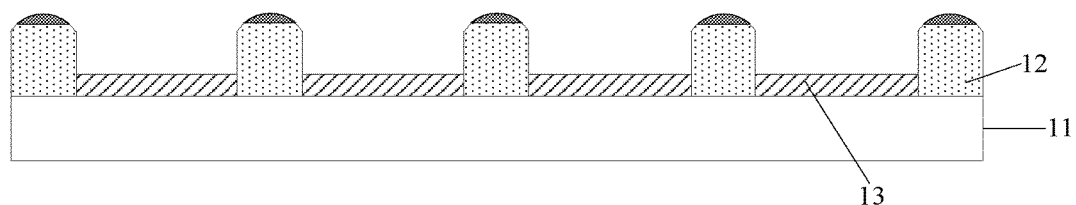
Figure 9C:
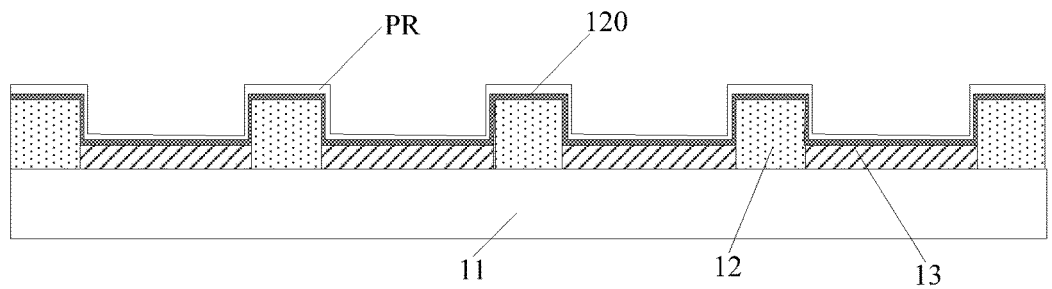
Figure 9D:
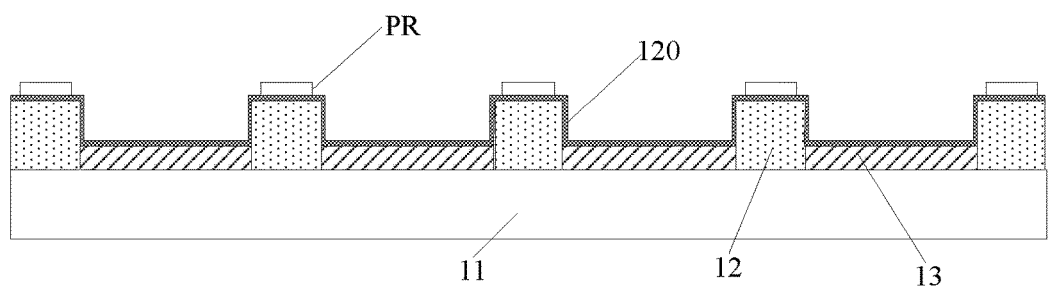
Figure 9E:
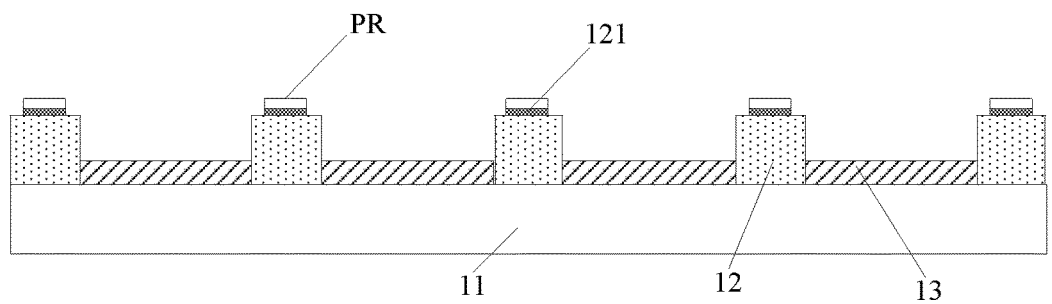
Figure 9F:
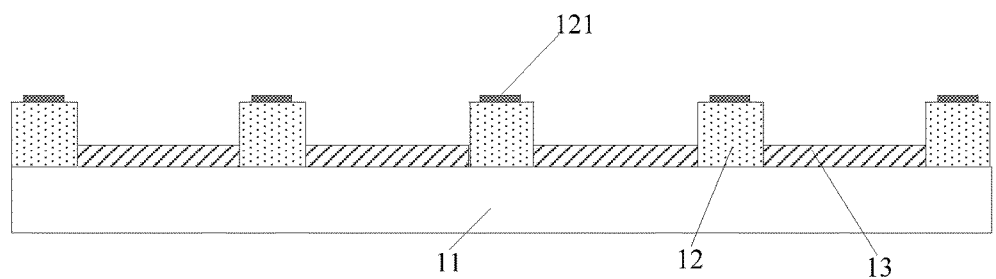

Step S704: forming a degradation region on a portion of the second surface of the block structure. The corresponding structure is shown in FIG. 8C and FIG. 9F.

The degradation region intended to degrade the carrier transportation may be formed on a portion of the second surface of the blocking structure, such that carriers may be suppressed to be transported in the portion of the organic functional film layer covering the blocking structure. Thus, the carriers may be blocked from being transported through the blocking structures to adjacent light-emitting units, and the cross-talk between adjacent light-emitting units may be suppressed.

In particular, in the step S704 shown in FIG. 7, forming the degradation region on a portion of the second surface of the blocking structure may include performing a surface treatment on the portion of the second surface of the blocking structure, and then forming the degradation region.

In the disclosed embodiments, the surface treatment to the portion of the surface of the blocking structure may irreversibly degrade the portion of the organic functional film layer covering the blocking structure, such that the portion of the organic functional film layer covering the blocking structure may never transport carriers. Thus, the carriers in the light-emitting unit may never be transported through the organic functional film layer covering the blocking structure to adjacent light-emitting units, and no light emission cross-talk may be present. In practical applications, as long as the degradation of the portion of the organic functional film layer is not affecting the normal operation of the adjacent light emitting unit, the degradation region may serve the purpose.

Step S705: forming an organic functional film layer on the surface of the blocking structures and/or the surface of the first electrodes. The organic functional film layer may include a light-emitting layer. The degradation region may be configured to degrade the carrier transportation in the portion of the organic functional film layer covering the degradation region.

In one embodiment, the surface treatment to a portion of the second surface of the blocking structure may include forming a mask on the second surface of the blocking structure exposing the portion of the second surface of the blocking structure; and performing a plasma treatment to cure oxygen atoms in the area exposed by the mask. The corresponding structures may be shown in FIGS. 8A-8C.

In particular, FIG. 8A illustrates a plurality of first electrodes 13 and a plurality of blocking structures 12 formed on a substrate 11. Further, referring to FIG. 8B, a mask M may be formed on the second surface of the blocking structure 12. The mask M may expose a portion of the second surface of the blocking structure 12. A pure oxygen plasma treatment may be performed to the exposed second surface of the blocking structure to cure oxygen atoms in the portion of the second surface of the blocking structure 12. As shown in FIG. 8C, the degradation region 121 may be formed. In practical applications, because a maximum width of the degradation region 121 is configured to be smaller than two thirds of a minimum width of the blocking structure 12 and three times an overall thickness of the organic functional film layer, a maximum width of the opening area of the mask M may satisfy the maximum width requirement of the degradation region 121.

Figure 8D:
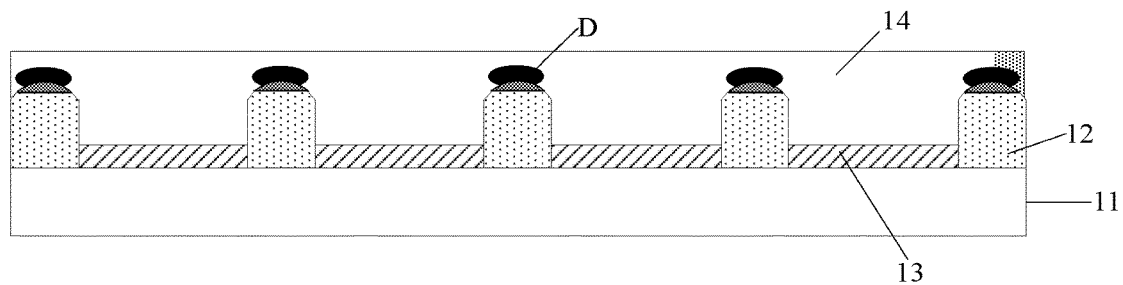

Further, as shown in FIG. 8D, an organic functional film layer 14 may be formed on the display panel in FIG. 8C. The cured oxygen atoms in the degradation region 121 may diffuse to the portion of the organic functional film layer 14 covering the degradation region 121 to degrade the portion of the organic functional film layer 14. The degraded portion of the organic functional film layer 14 may be represented by D in FIG. 8D. Thus, carriers may be suppressed to be transported in the blocking structure region, and the cross-talk between adjacent light-emitting units may be suppressed.

In another embodiment, the surface treatment to a portion of the second surface of the blocking structure may include depositing a photo-catalyst layer having a pre-determined thickness on the portion of the second surface of the blocking structure to form the degradation region, where the photo-catalyst may be titanium dioxide. The corresponding structures may be shown in FIGS. 9A-9F.

In particular, FIG. 9A illustrates a plurality of first electrodes 13 and a plurality of blocking structures 12 formed on a substrate 11. Further, referring to FIG. 9B, a titanium dioxide layer 120 having a pre-determined thickness may be deposited on the second surface of the blocking structure 12 and on the first side of the first electrode 13. In practical applications, the titanium dioxide layer 120 may be formed by a chemical vapor deposition (CVD) process, a physical vapor deposition (PVD) process, or a sol-gel process, which is for illustrative purposes, and is not intended to limit the scope of the present disclosure. Further, as shown in FIG. 9C, a photoresist layer PR may be coated on the surface of the titanium dioxide layer 120. Then, as shown in FIG. 9D, a graphical patterning process may be performed to remove the photoresist layer PR except on the portion of the surface of the blocking structure 12. Then, the exposed titanium dioxide layer 120 may be etched to obtain the graphical pattern in FIG. 9E. Then, the remained photoresist layer PR may be removed to form the degradation region 121 as shown in FIG. 9F.

Similarly, in practical applications, because a maximum width of the degradation regions 121 is configured to be smaller than two thirds of a minimum width of the block structures 12 and three times an overall thickness of the organic functional film layer 14, a maximum width of the mask opening may also satisfy the maximum width requirement of the degradation region 121. In addition, the thickness of the titanium dioxide layer 120 may be configured to be within a desired range to ensure that the photo-catalyst cause no damages to the portion of the organic functional film layer 14 in the light-emitting region.

Figure 9G:
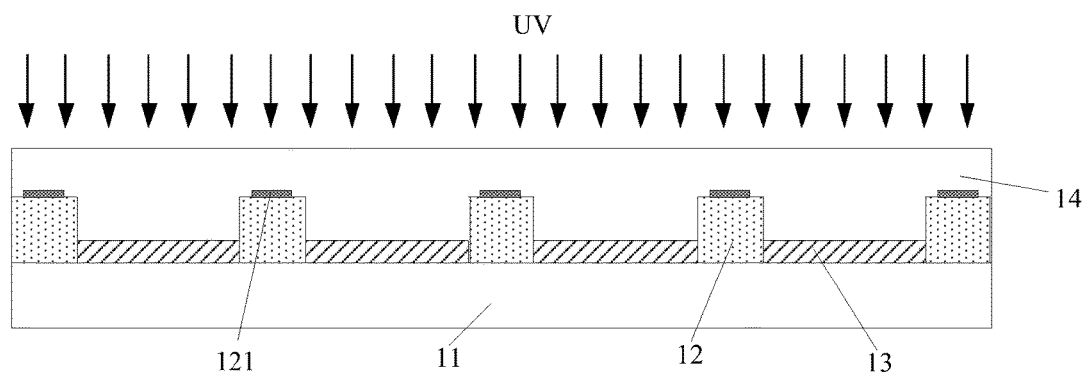

Further, as shown in FIG. 9G, after the organic functional film layer 14 is formed on the organic light-emitting diode display panel in FIG. 9F, ultraviolet (UV) light may irradiate on the organic light-emitting diode display panel. Under the photo-catalyst effect of the titanium dioxide layer in the degradation region 121, the portion of the organic functional film layer 14 covering the degradation region 121 may be degraded, and may lose the transportability of carriers. The degraded portion of the organic functional film layer 14 may be represented by D in FIG. 9H. Thus, carriers may be suppressed to be transported in the degradation region 121, and the cross-talk between adjacent light-emitting units may be suppressed.

Figure 9H:
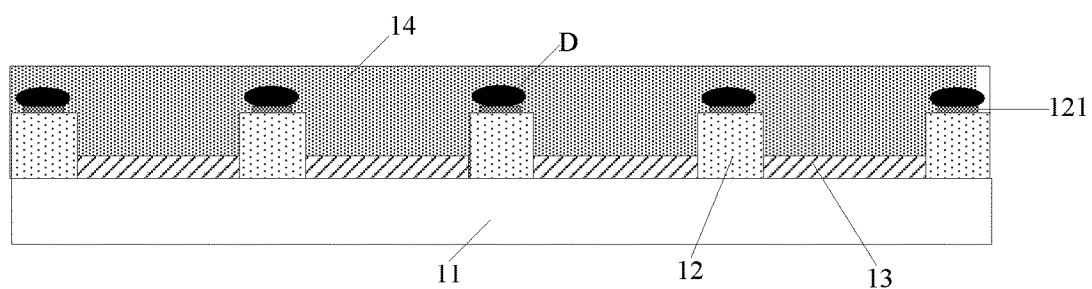

Further, in the display panel in FIG. 9H, the second electrode 15 may be formed between the organic functional film layers to complete the fabrication process of the organic light-emitting diode display panel.

The present disclosure provides an organic light-emitting diode display panel, a fabrication method thereof, and a display apparatus. The display panel includes a substrate, a plurality of blocking structures disposed on the substrate, a plurality of first electrodes configured between adjacent blocking structures, and an organic functional film layer covering the first electrodes and/or the blocking structures. The blocking structure has a first surface facing the substrate and an opposing second surface far away from the substrate. The organic functional film layer includes a light-emitting layer. A degradation region is configured in a portion of the second surface of the blocking structure. The degradation region degrades a carrier transportation in the portion of the organic functional film layer covering the degradation region. The degradation region disposed in the portion of the second surface of the blocking structure blocks carriers from being transported across the portion of the organic functional film layer covering the degradation region. Thus, carriers are blocked from crossing the blocking structure into adjacent light-emitting units, and the cross-talk between light-emitting units is suppressed.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention. Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A fabrication method for an organic light-emitting display panel, comprising:
   providing a substrate;
   forming a plurality of first electrodes on the substrate;
   forming a plurality of blocking structures, wherein a blocking structure is disposed between adjacent first electrodes and has a first surface facing the substrate and an opposing second surface far away from the substrate;
   forming a degradation region on a portion of the second surface of the block structure; and
   forming an organic functional film layer on at least one of the blocking structure and the first electrode, wherein:

the organic functional film layer includes a light-emitting layer; and the degradation region degrades the carrier transportation in a portion of the organic functional film layer covering the degradation region in which the portion of the organic functional film layer covers the degradation region.

2. The fabrication method according to claim 1, wherein:
forming the degradation region on a portion of the second surface of the blocking structure includes performing a surface treatment on the portion of the second surface of the blocking structure, and then forming the degradation region.

3. The fabrication method according to claim 2, wherein:
the surface treatment to the portion of the second surface of the blocking structure includes forming a mask on the second surface of the blocking structure exposing the portion of the surface of the blocking structure, and performing a plasma treatment to cure oxygen atoms in the area exposed by the mask.

4. The fabrication method according to claim 2, wherein:
the surface treatment to the portion of the second surface of the blocking structure includes depositing a photo-catalyst layer having a pre-determined thickness on the portion of the second surface of the blocking structure to form the degradation region.

5. A display apparatus, comprising an organic light-emitting display panel including:
a substrate;
a plurality of blocking structures disposed on the substrate, wherein a blocking structure has a first surface facing the substrate and an opposing second surface far away from the substrate;
a plurality of first electrodes, wherein a first electrode is configured between adjacent blocking structures;
an organic functional film layer covering at least one of the plurality of first electrodes and the plurality of blocking structures, wherein the organic functional film layer includes a light-emitting layer; and
a degradation region disposed in a portion of the second surface of the blocking structure, wherein the degradation region degrades a carrier transportation in a portion of the organic functional film layer in which the portion of the organic functional film layer covers the degradation region.

6. The display apparatus according to claim 5, wherein:
an orthogonal projection of the degradation region onto the substrate surrounds an orthogonal projection of the first electrode onto the substrate.

7. The display apparatus according to claim 5, wherein:
a maximum width of the degradation region is smaller than two thirds of a minimum width of the blocking structure.

8. An organic light-emitting display panel, comprising:
a substrate;
a plurality of blocking structures disposed on the substrate, wherein a blocking structure has a first surface facing the substrate and an opposing second surface far away from the substrate;
a plurality of first electrodes, wherein a first electrode is configured between adjacent blocking structures;
an organic functional film layer covering at least one of the plurality of first electrodes and the plurality of blocking structures, wherein the organic functional film layer includes a light-emitting layer; and
a degradation region disposed in a portion of the second surface of the blocking structure, wherein the degradation region degrades a carrier transportation in a portion of the organic functional film layer in which the portion of the organic functional film layer covers the degradation region.

9. The organic light-emitting display panel according to claim 8, wherein:
an orthogonal projection of the degradation region onto the substrate surrounds an orthogonal projection of the first electrode onto the substrate.

10. The organic light-emitting display panel according to claim 8, wherein:
a maximum width of the degradation region is smaller than two thirds of a minimum width of the blocking structure.

11. The organic light-emitting display panel according to claim 8, wherein:
the portion of the second surface of the blocking structure is treated and cured by a pure oxygen plasma to form the degradation region.

12. The organic light-emitting display panel according to claim 11, wherein:
an oxygen atom concentration in the degradation region is at least about 100 ppm.

13. The organic light-emitting display panel according to claim 8, wherein:
the degradation region includes a material of a photo-catalyst.

14. The organic light-emitting display panel according to claim 13, wherein:
the degradation region includes a material of titanium dioxide.

15. The organic light-emitting display panel according to claim 13, wherein:
the degradation region has a thickness less than about 50 nm.

16. The organic light-emitting display panel according to claim 8, wherein:
the organic functional film layer further includes a hole injection layer covering at least one of the first electrode and the blocking structure wherein the hole injection layer has a first side facing the first electrode and an opposing second side far away from the first electrode, a hole transport layer disposed on the second side of the hole injection layer wherein the hole transport layer has a first side facing the first electrode and an opposing second side far away from the first electrode, an electron transport layer disposed on the second side of the hole transport layer wherein the electron transport layer has a first side facing the first electrode and an opposing second side far away from the first electrode, and an electron injection layer disposed on the second side of the electron transport layer wherein the electron injection layer has a first side facing the first electrode and an opposing second side far away from the first electrode;
the light-emitting layer is disposed between the hole transport layer and the electron transport layer;
the organic light-emitting display panel further includes a second electrode disposed on the second side of electron injection layer wherein the second electrode has a first side facing the first electrode and an opposing side far away from the first electrode; and
a maximum width of the degradation region is smaller than three times a height between the first side of the hole injection layer and the second side of the second electrode.

17. The organic light-emitting display panel according to claim 16, wherein:
the light-emitting layer includes a plurality of red light-emitting regions, green light-emitting regions, and blue light-emitting regions;
light-emitting regions of different colors are separated by a pre-determined distance; and
a maximum width of the degradation region is smaller than three times a height between the first side of the hole injection layer corresponding to the red light-emitting region and the second side of the second electrode.

18. The organic light-emitting display panel according to claim 16, wherein:
the light-emitting layer is a white light-emitting layer;
the white light-emitting layer includes a red light-emitting sub-layer, a green light-emitting sub-layer, a blue light-emitting sub-layer stacked together; or
the white light-emitting layer includes a yellow light-emitting sub-layer and a blue light-emitting sub-layer stacked together.

19. The organic light-emitting display panel according to claim 16, wherein:
the plurality of light-emitting regions are one-to-one corresponding to the plurality of first electrodes.

* * * * *